(12) United States Patent
Kim et al.

(10) Patent No.: US 7,960,785 B2
(45) Date of Patent: Jun. 14, 2011

(54) SEMICONDUCTOR INTEGRATED CIRCUIT DEVICES

(75) Inventors: Yong-Don Kim, Hwaseong-si (KR);
Yong-Chan Kim, Suwon-si (KR);
Joung-Ho Kim, Suwon-si (KR);
Mueng-Ryul Lee, Seoul (KR);
Eung-Kyu Lee, Seoul (KR);
Jong-Wook Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 261 days.

(21) Appl. No.: 12/382,596

(22) Filed: Mar. 19, 2009

(65) Prior Publication Data
US 2009/0267148 A1    Oct. 29, 2009

(30) Foreign Application Priority Data
Mar. 21, 2008    (KR) .................. 10-2008-0026386

(51) Int. Cl.
*H01L 27/088*    (2006.01)
(52) U.S. Cl. ............ 257/337; 257/E27.06; 257/E29.256

(58) Field of Classification Search .................. 257/337, 257/500, E27.06, E29.256, 391
See application file for complete search history.

(56) References Cited

U.S. PATENT DOCUMENTS
6,376,891 B1 *    4/2002    Nagatani et al. .............. 257/492

FOREIGN PATENT DOCUMENTS
| JP | 2005-038962 | 2/2005 |
| JP | 2005-303138 | 10/2005 |
| KR | 10-2007-0069552 | 7/2007 |

* cited by examiner

*Primary Examiner* — Zandra Smith
*Assistant Examiner* — Paul E Patton
(74) *Attorney, Agent, or Firm* — Harness, Dickey & Pierce, P.L.C.

(57) ABSTRACT

A semiconductor integrated circuit device may include: a substrate that includes a high-voltage device region and a low-voltage device region defined on the substrate; a first buried impurity layer formed in at least a portion of the high-voltage device region and coupled to a first voltage; a second buried impurity layer formed in at least a portion of the low-voltage device region and coupled to a second voltage less than the first voltage; and a well formed on the second buried impurity layer in the low-voltage device region and coupled to a third voltage less than the second voltage.

20 Claims, 6 Drawing Sheets

SEMICONDUCTOR INTEGRATED CIRCUIT DEVICES

PRIORITY STATEMENT

This application claims priority from Korean Patent Application No. 10-2008-0026386, filed on Mar. 21, 2008, in the Korean Intellectual Property Office (KIPO), the entire contents of which are incorporated herein by reference.

BACKGROUND

1. Field

Example embodiments relate to semiconductor integrated circuit (IC) devices. Also, example embodiments relate to semiconductor IC devices that include transistors operating at different voltages.

2. Description of Related Art

Semiconductor integrated circuit devices, such as a System On Chip (SOC), a MicroController Unit (MCU), and a Display Driver IC (DDI), may include a plurality of peripheral devices such as processors, memories, logic circuits, audio/video image processing circuits, and/or various interface circuits. Thus, the semiconductor integrated circuit devices may include transistors having different driving voltages. For example, a semiconductor integrated circuit device may include high-voltage driving transistors and/or low-voltage driving transistors.

In a semiconductor integrated circuit device including high- and low-voltage transistors, the high-voltage transistors may be electrically isolated from the low-voltage transistors. The high-voltage transistors affecting the operation of the low-voltage transistors may cause malfunctions of the low-voltage transistors.

SUMMARY

Example embodiments may provide semiconductor integrated circuit devices with improved reliability.

According to example embodiments, a semiconductor integrated circuit device may include a substrate that may include a high-voltage device region and/or a low-voltage device region defined on the substrate; a first buried impurity layer formed in at least a portion of the high-voltage device region and/or coupled to a first voltage; a second buried impurity layer formed in at least a portion of the low-voltage device region and/or coupled to a second voltage less than the first voltage; and/or a well formed on the second buried impurity layer in the low-voltage device region and/or coupled to a third voltage less than the second voltage.

According to example embodiments, a semiconductor integrated circuit device may include a substrate that may include a base substrate of a first conductivity type and/or an epitaxial layer of a second conductivity type formed on the base substrate; a first buried impurity layer of the second conductivity type formed in at least a portion of an interface between the base substrate and the epitaxial layer; a deep well of the first conductivity type formed on the first buried impurity layer; and/or a semiconductor device formed on the deep well. The semiconductor device may operate using a first voltage. The first buried impurity layer may be coupled to a second voltage greater than the first voltage.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION OF EXAMPLE EMBODIMENTS

Figure 1:
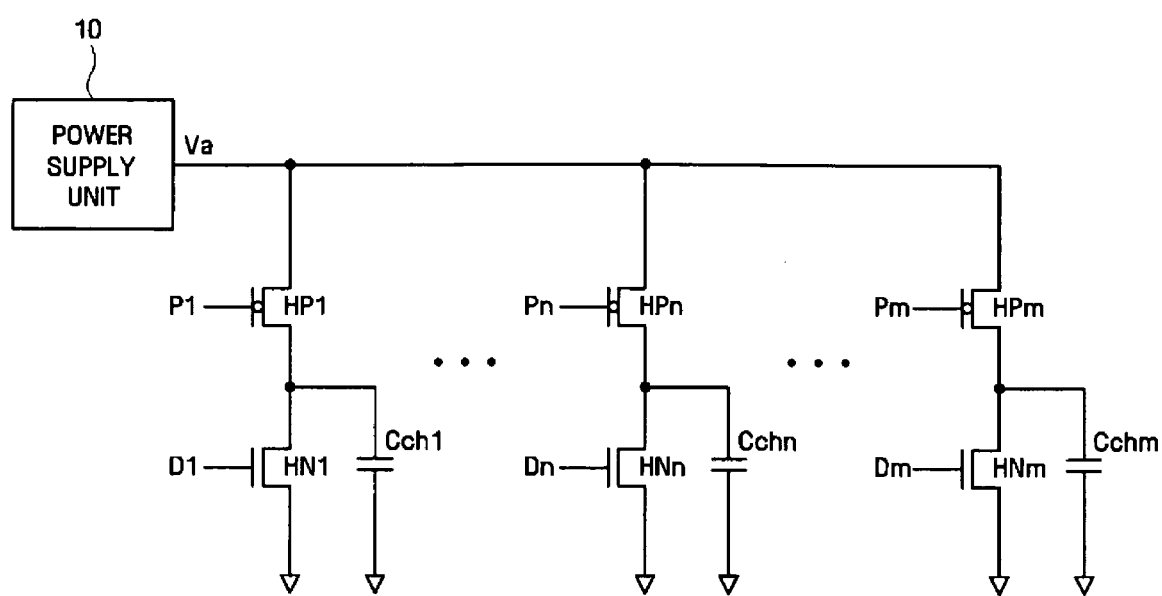
FIG. 1 is a circuit diagram of semiconductor integrated circuit devices according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those of ordinary skill in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising,"

"includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a circuit diagram of semiconductor integrated circuit devices according to example embodiments.

While FIG. 1 shows that a semiconductor integrated circuit device may be a Plasma Display Panel (PDP) data driver IC that is a Display Driver IC (DDI) for PDPs, the semiconductor integrated circuit device also may be another semiconductor integrated circuit device. One of ordinary skill in the art should understand that the semiconductor integrated circuit device may be, for example, a System On Chip (SOC) or MicroController Unit (MCU).

Referring to FIG. 1, a semiconductor integrated circuit device according to example embodiments may include power supply unit 10, plurality of pull-up transistors HP1, HPn, and/or HPm, and/or plurality of pull-down transistors HN1, HNn, and/or HNm.

Power supply unit 10 may produce and/or supply driving voltage Va. For example, power supply unit 10 may include a Switching Mode Power Supply (SMPS).

Plurality of channel capacitors Cchl, Cchn, and/or Cchm may represent a plurality of channels for a display panel. Plurality of channel capacitors Cchl, Cchn, and/or Cchm may be charged and/or discharged to a certain voltage depending on the operation of plurality of pull-up transistors HP1, HPn, and/or HPm and/or plurality of pull-down transistors HN1, HNn, and/or HNm.

Plurality of pull-up transistors HP1, HPn, and/or HPm may be turned on and/or off in response to pull-up signals P1, Pn, and/or Pm. Plurality of pull-down transistors HN1, HNn, and/or HNm may be turned on and/or off in response to pull-down signals D1, Dn, and/or Dm. For example, when plurality of pull-up transistors HP1, HPn, and/or HPm are turned on and plurality of pull-down transistors HN1, HNn, and/or HNm are turned off, plurality of channel capacitors Cchl, Cchn, and/or Cchm may be charged with driving voltage Va. In another example, when plurality of pull-up transistors HP1, HPn, and/or HPm are turned off and plurality of pull-down transistors HN1, HNn, and/or HNm are turned on, plurality of channel capacitors Cchl, Cchn, and/or Cchm may be discharged.

A DDI may require a significantly high driving voltage Va. For example, driving voltage Va may be as high as about 50 V to about 70 V. Thus, plurality of pull-up transistors HP1, HPn, and/or HPm may include high-voltage transistors of a first conductivity type (e.g., P-type). Plurality of pull-down transistors HN1, HNn, and/or HNm may include high-voltage transistors of a second conductivity type (e.g., N-type).

Figure 2:
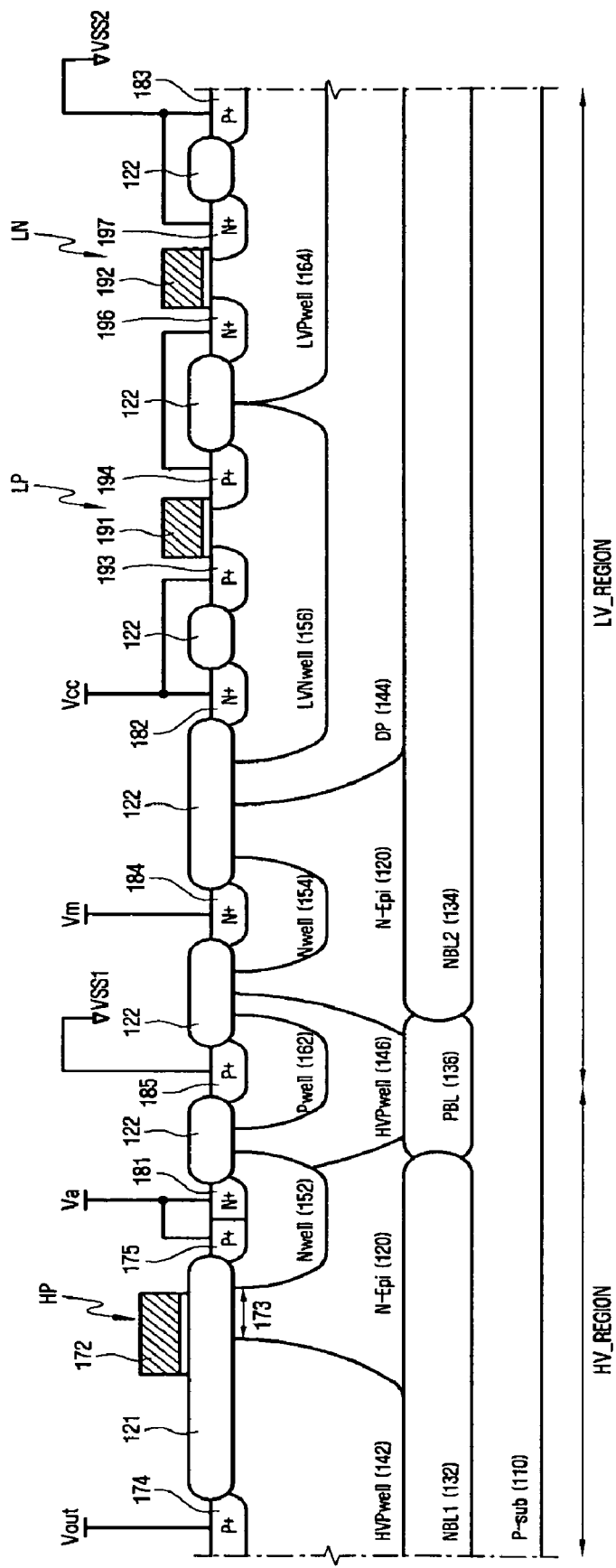
FIG. 2 is a cross-sectional view of a semiconductor integrated circuit device according to example embodiments.

FIG. 2 is a cross-sectional view of a semiconductor integrated circuit device according to example embodiments.

Figure 3:
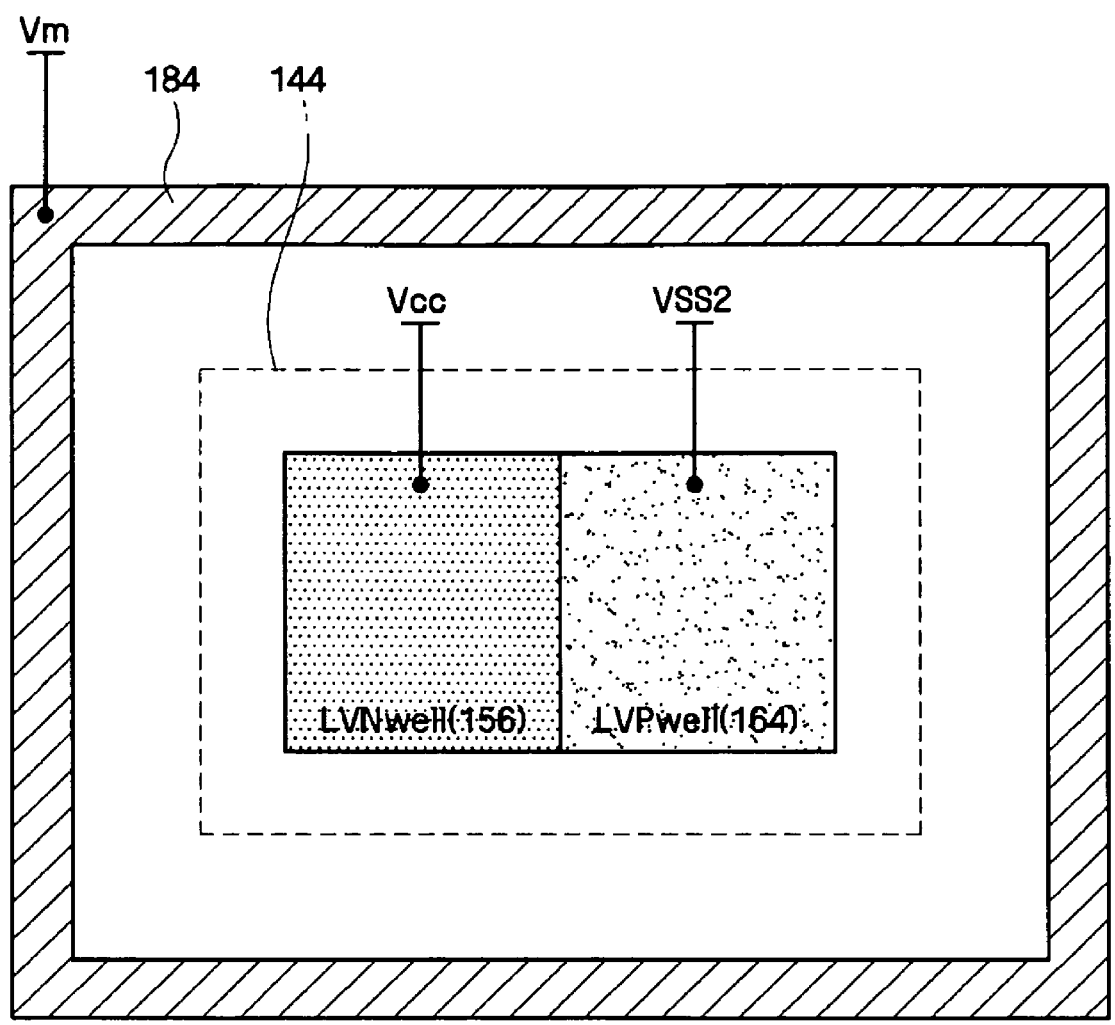
FIG. 3 is a layout diagram for explaining an intermediate voltage in the semiconductor integrated circuit device shown in FIG. 2.

FIG. 3 is a layout diagram for explaining intermediate voltage Vm in the semiconductor integrated circuit device shown in FIG. 2.

Referring first to FIG. 2, the semiconductor integrated circuit device according to example embodiments may have high-voltage device region HV_REGION and/or low-voltage device region LV_REGION defined in substrates 110 and/or 120. High-voltage device region HV_REGION may have transistors operating at high voltage, while low-voltage device region LV_REGION may have transistors operating at low voltage. For example, high-voltage device region HV_REGION may include a high-voltage digital circuit. Low-voltage device region LV_REGION may include, for example, a low-voltage digital circuit and/or an analog circuit.

For convenience of explanation, FIG. 2 shows that high-voltage device region HV_REGION may have a high-voltage transistor HP of a first conductivity type (for example, corresponding to pull-up transistor HPn shown in FIG. 1), while low-voltage device region LV_REGION may have first low-voltage transistor LP of a first conductivity type and/or second low-voltage transistor LN of a second conductivity type (for example, corresponding to a control circuit for providing pull-up signals P1, Pn, and/or Pm and/or pull-down signals D1, Dn, and/or Dm, as illustrated in FIG. 1).

For example, substrates 110 and 120 may be a base substrate 110 of a first conductivity type, such as a P-type, and/or an epitaxial layer 120 of a second conductivity type, such as an N-type. For convenience of explanation, substrates 110 and 120 will be referred to as base substrate 110 and epitaxial layer 120. Base substrate 110 may be, for example, a silicon substrate, a Ga—As substrate, a Si—Ge substrate, a ceramic substrate, a quartz substrate, a glass substrate for a display device, and/or a silicon on insulator (SOI) substrate. Alternatively, epitaxial layer 120 may have the same conductivity type as base substrate 110.

First buried impurity layer 132 of the second conductivity type may be formed in at least portions of high-voltage device region HV_REGION. Second buried impurity layer 134 of the second conductivity type may be formed in at least portions of the low-voltage device region LV_REGION. Third buried impurity layer 136 of the first conductivity type may be formed between first buried impurity layer 132 and second buried impurity layer 134. First buried impurity layer 132, second buried impurity layer 134, and/or third buried impurity layer 136 may be formed at an interface between base substrate 110 and epitaxial layer 120. For example, a first portion of first buried impurity layer 132, second buried impurity layer 134, and/or third buried impurity layer 136 may be formed on base substrate 110, while a second portion may be formed in epitaxial layer 120. That is, first buried impurity layer 132, second buried impurity layer 134, and/or third buried impurity layer 136 may be first formed within base substrate 110 and then epitaxial layer 120 may be formed on base substrate 110, followed by thermal diffusion of first buried impurity layer 132, second buried impurity layer 134, and/or third buried impurity layer 136 into base substrate 110 and/or epitaxial layer 120.

First high-voltage well 142 may be formed in high-voltage device region HV_REGION so that first high-voltage well 142 may or may not be in contact with first buried impurity layer 132. First high-voltage well 142 may function as a drift region of a high-voltage transistor HP, as will be described later.

Deep well 144 of a first conductivity type may be formed in low-voltage device region LV_REGION so that deep well 144 may or may not be in contact with second buried impurity layer 134. As will be described later, deep well 144 may electrically isolate second buried impurity layer 134 from first low-voltage well 156 of a second conductivity type (for example, first low-voltage transistor LP formed within first low-voltage well 156) and/or second low-voltage well 164 of a second conductivity type (for example, second low-voltage transistor LN formed within second low-voltage well 164).

Second high-voltage well 146 of the first conductivity type may be formed between high-voltage device region HV_RE-GION and low-voltage device region LV_REGION so that second high-voltage well 146 may or may not be in contact with third buried impurity layer 136. Second high-voltage well 146 may function as an isolating well. For example, second high-voltage well 146 may cooperate with third buried impurity layer 136 to electrically isolate high-voltage device region HV_REGION from low-voltage device region LV_REGION.

First high-voltage well 142, second high-voltage well 146, and/or deep well 144 may or may not be formed using the same mask. For example, if necessary, first high-voltage well 142 and second high-voltage well 146 may be formed using the same mask, while deep well 144 may be formed using a separate mask.

First low-voltage well 156 of the second conductivity type and/or second low-voltage well 164 of the first conductivity type may be formed within deep well 144 in low-voltage device region LV_REGION. Further, first well 154 of the second conductivity type may be formed in low-voltage device region LV_REGION.

Second well 152 of the second conductivity type may be formed within high-voltage device region HV_REGION.

Third well 162 of the first conductivity type may be formed within second high-voltage well 146, for example, between high-voltage device region HV_REGION and low-voltage device region LV_REGION.

First low-voltage well 156, first well 154, and/or second well 152 may or may not be formed using the same mask. Second low-voltage well 164 and/or third well 162 also may or may not be formed using the same mask.

Field oxide layer 122 may be formed on base substrate 110 and/or epitaxial layer 120 so as to define regions in which high-voltage transistor HP, first low-voltage transistor LP, and/or second low-voltage transistor LN may be formed. High-voltage gate insulating layer 121 may overly base substrate 110 and/or epitaxial layer 120.

High-voltage transistor HP may be a diffusion metal oxide semiconductor (DMOS) transistor including gate electrode 172, channel region 173, drain 174, and/or source 175. Drain 174 may be formed within first high-voltage well 142 at concentration higher than first high-voltage well 142. As described above, first high-voltage well 142 may function as a drift region. Thus, the drift region and/or channel region 173 may be formed between drain 174 and source 175 of high-voltage transistor HP. The drift region may be needed to support a high breakdown voltage (BV). Source 175 also may be formed in second well 152. Drain 174 may be coupled to output voltage Vout, for example, while source 175 is coupled to driving voltage Va.

Driving voltage Va may be applied to first ohmic contact 181 that is formed within second well 152 in order to contact source 175 of high-voltage transistor HP. For example, driving voltage Va may be greater than or equal to about 50 V and/or less than or equal to about 70 V.

First low-voltage transistor LP of the first conductivity type may include gate electrode 191, source 193, and/or drain 194. Source 193 and/or drain 194 may be formed within first low-voltage well 156.

Supply voltage Vcc may be applied to second ohmic contact 182, that may be formed within first low-voltage well 156, together with source 193 and/or drain 194 of first low-voltage transistor LP. For example, supply voltage Vcc may be greater than or equal to about 1 V and/or less than or equal to about 5 V.

Second low-voltage transistor LN of the second conductivity type may include gate electrode 192, drain 196, and/or source 197. Drain 196 and/or source 197 may be formed within second low-voltage well 164.

Third ohmic contact 183 may be coupled to ground voltage VSS2 and/or may be formed within second low-voltage well 164, together with drain 196 and/or source 197.

Intermediate voltage Vm may be applied to fourth ohmic contact 184, that may be formed within first well 154. For example, intermediate voltage Vm may be greater than or equal to about 10 V and/or less than or equal to about 30 V.

Fifth ohmic contact 185 may be coupled to ground voltage VSS1 and/or may be formed within third well 162.

Operation of semiconductor integrated circuit devices according to example embodiments is described in detail below.

Driving voltage Va may be transferred to first buried impurity layer 132 through first ohmic contact 181, second well 152, and/or epitaxial layer 120. For example, first buried impurity layer 132 may be coupled to driving voltage Va. Supply voltage Vcc may be applied via second ohmic contact 182 to first low-voltage well 156 so that first low-voltage well 156 may be coupled to supply voltage Vcc. Ground voltage VSS2 may be applied via third ohmic contact 183 to second low-voltage well 164 so that second low-voltage well 164 may be coupled to ground voltage VSS2. Intermediate voltage Vm may be transferred to second buried impurity layer 134 through fourth ohmic contact 184 and/or first well 154 so that second buried impurity layer 134 may be coupled to intermediate voltage Vm. Ground voltage VSS1 may be transferred to third buried impurity layer 136 through fifth ohmic contact 185, third well 162, and/or second high-voltage well 146 so that third buried impurity layer 136 may be coupled to ground voltage VSS1. Base substrate 110 also may be coupled to ground voltage VSS1.

As described above, driving voltage Va used in high-voltage device region HV_REGION may be greater than or equal to about 50 V and/or less than or equal to about 70 V, while supply voltage Vcc used in low-voltage device region LV_REGION may be greater than or equal to about 1 V and/or less than or equal to about 5 V. Driving voltage Va affecting low-voltage device region LV_REGION may cause malfunctions of elements in low-voltage device region LV_REGION. Thus, low-voltage device region LV_REGION may be electrically isolated from driving voltage Va.

To accomplish this, fifth ohmic contact 185, third well 162, and/or third buried impurity layer 136—all of which may be coupled to ground voltage VSS1—may electrically isolate high-voltage device region HV_REGION from low-voltage device region LV_REGION.

Further, ground voltage VSS1 used in high-voltage device region HV_REGION may be electrically isolated from ground voltage VSS2 used in low-voltage device region LV_REGION. Because of electrical isolation between ground voltage VSS1 and ground voltage VSS2, even though ground voltage VSS1 may vary in high-voltage device region HV_REGION, ground voltage VSS2 may not vary in low-voltage device region LV_REGION.

Furthermore, second buried impurity layer 134 may be coupled to intermediate voltage Vm, which will be described in more detail later with reference to FIGS. 2 and 4-6. Since second buried impurity layer 134 may be coupled to intermediate voltage Vm, second buried impurity layer 134 may be electrically isolated from first low-voltage well 156 and/or second low-voltage well 164 by deep well 144. That is, deep well 144 may reduce the effect of intermediate voltage Vm on first low-voltage well 156 and/or second low-voltage well 164.

In particular, referring to FIG. 3, fourth ohmic contact 184 (to which intermediate voltage Vm may be applied) may be formed at a surface of epitaxial layer 120 so as to surround first low-voltage well 156, that may have first low-voltage transistor LP formed therein, and/or second low-voltage well 164, that may have second low-voltage transistor LN formed therein. Formation of fourth ohmic contact 184 in this way may prevent first low-voltage transistor LP and/or second low-voltage transistor LN from being affected by driving voltage Va.

In the following description, the reason that second buried impurity layer 134 may be coupled to intermediate voltage Vm is described with reference to FIGS. 2 and 4-6.

Figure 4:
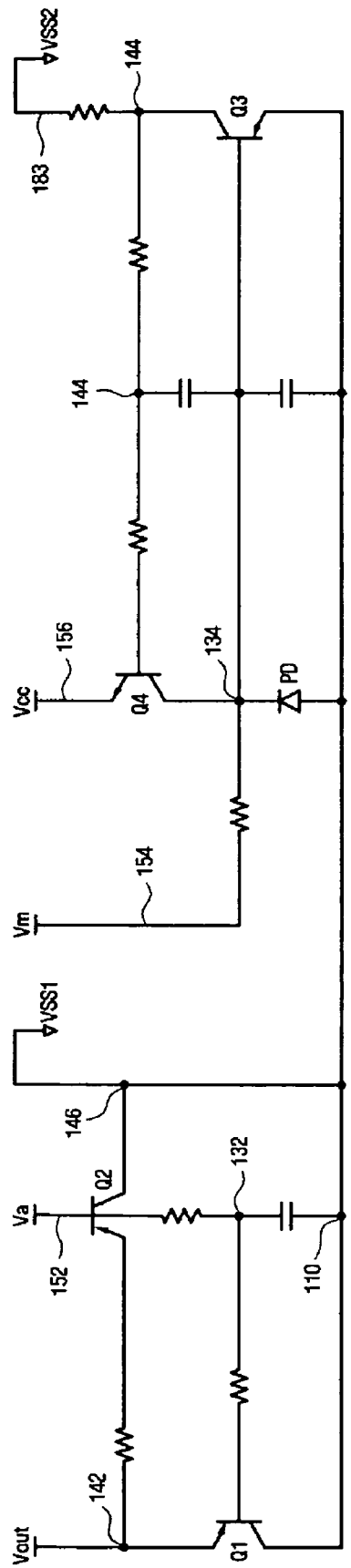
FIG. 4 is an equivalent circuit diagram of the semiconductor integrated circuit device of FIG. 2.
Figure 5:
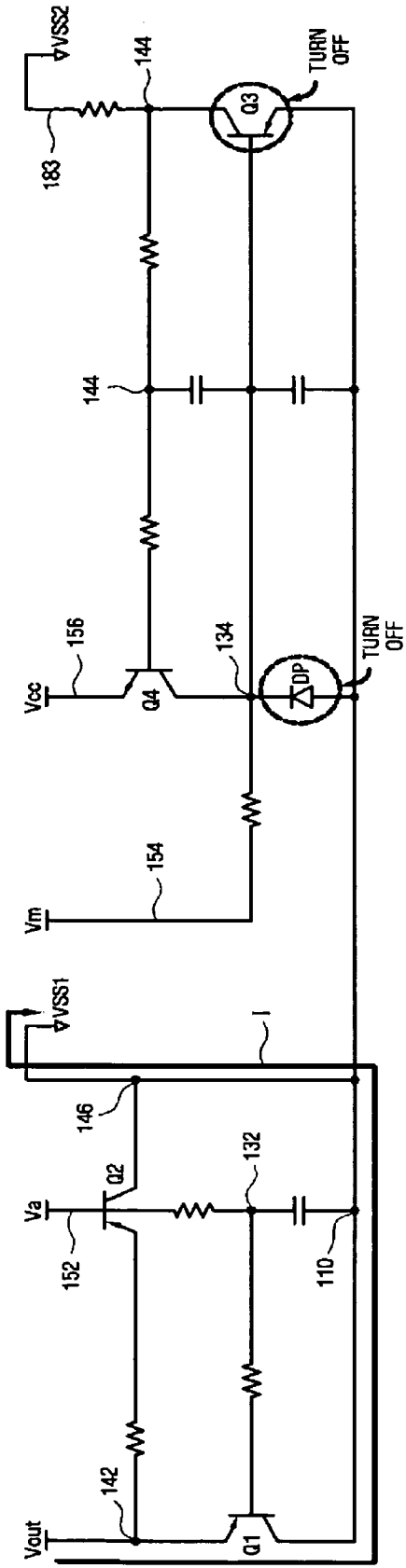
FIGS. 5 and 6 illustrate operation of semiconductor integrated circuit devices according to example embodiments.
Figure 6:
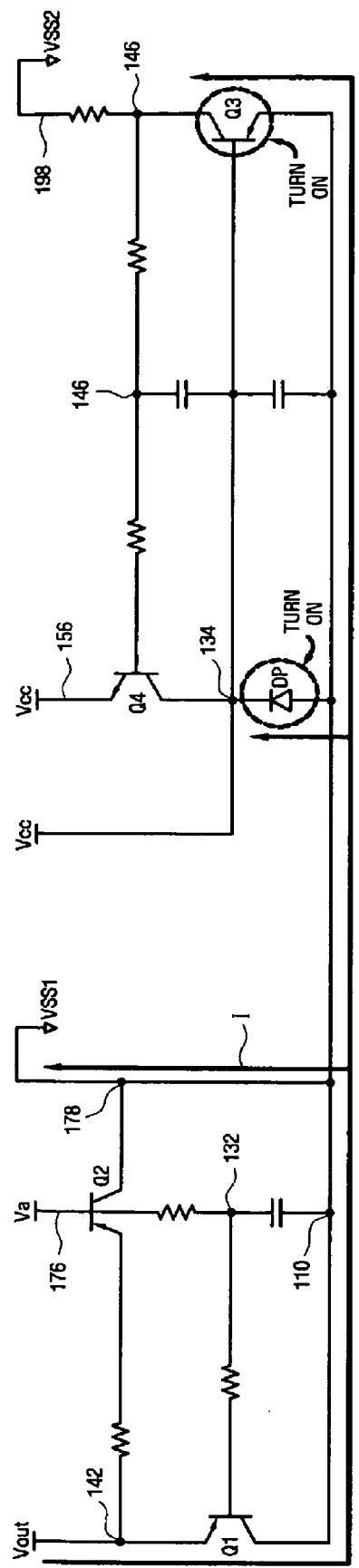

FIG. 4 is an equivalent circuit diagram of the semiconductor integrated circuit device of FIG. 2. FIGS. 5 and 6 illustrate operation of semiconductor integrated circuit devices according to example embodiments.

Referring first to FIGS. 2 and 4, since base substrate 110 and/or first high-voltage well 142 may have a first conductivity type, such as a P-type, and first buried impurity layer 132 may have a second conductivity type, such as an N-type, first parasitic PNP bipolar transistor Q1 may be formed between base substrate 110, first buried impurity layer 132, and/or first high-voltage well 142.

Since first high-voltage well 142 and/or second high-voltage well 146 may have the first conductivity type, and/or second well 152 may have the second conductivity type, second parasitic PNP bipolar transistor Q2 may be formed between first high-voltage well 142, second well 152, and/or second high-voltage well 146.

Similarly, third parasitic PNP bipolar transistor Q3 may be formed between base substrate 110, second buried impurity layer 134, and/or deep well 144.

Similarly, parasitic NPN bipolar transistor Q4 may be formed between second buried impurity layer 134, deep well 144, and/or first low-voltage well 156.

Base substrate 110 may have a first conductivity type and/or parasitic diode PD may be disposed between base substrate 110 and second buried impurity layer 134.

Referring to FIG. 5, in a normal operating mode, first parasitic PNP bipolar transistor Q1 may not be turned on because driving voltage Va may be greater than output voltage Vout. However, in a special operating mode in which output voltage Vout is greater than driving voltage Va (e.g., Vout−Va>0.6 V), first parasitic PNP bipolar transistor Q1 may be turned on. When first parasitic PNP bipolar transistor Q1 is turned on, current I from output voltage Vout to base substrate 110 may be produced, thus increasing the voltage level of base substrate 110. For example, the voltage level of base substrate 110 may be increased to about 10 V.

Under these circumstances, parasitic diode PD and/or third PNP bipolar transistor Q3 may be turned off because a voltage greater than 10 V (e.g., about 10 V to about 30 V) may be applied to second buried impurity layer 134. That is, since a voltage at an anode of parasitic diode PD may be greater than a voltage at a cathode of parasitic diode PD, parasitic diode PD may not be turned on. Similarly, because a voltage at a base of third PNP bipolar transistor Q3 may be greater than a voltage at an emitter of third PNP bipolar transistor Q3, third PNP bipolar transistor Q3 may not be turned on.

Thus, current I produced between output voltage Vout and base substrate 110 may flow out into ground voltage VSS1.

Unlike in the embodiment described above, assume that second buried impurity layer 134 may be coupled to supply voltage Vcc (e.g., about 1 V to about 5 V), as shown in FIG. 6.

Referring to FIG. 6, when first parasitic PNP bipolar transistor Q1 may be turned on, the voltage level of base substrate 110 may be increased to about 10 V. In this case, a voltage difference between base substrate 110 and second buried impurity layer 134 may cause parasitic diode PD and/or third PNP bipolar transistor Q3 to turn on. Then, current I produced between output voltage Vout and base substrate 110 may flow into ground voltage VSS1 and/or low-voltage device region LV_REGION, thereby causing malfunctions of the elements in low-voltage device region LV_REGION.

Thus, as described above, when second buried impurity layer 134 may be coupled to intermediate voltage Vm, low-voltage transistors formed on second buried impurity layer 134 may be able to operate stably. Thus, semiconductor integrated circuit devices that include second buried impurity layer 134 coupled to intermediate voltage Vm may have improved operating reliability.

Intermediate voltage Vm may be, for example, greater than or equal to about 10 V and/or less than or equal to about 30 V. For example, intermediate voltage Vm may be of any value between a voltage (e.g., supply voltage Vcc) used in low-voltage device region LV_REGION and a voltage (e.g., driving voltage Va) used in high-voltage device region HV_REGION.

Semiconductor integrated circuit devices according to example embodiments may further include an intermediate voltage generator needed to produce intermediate voltage Vm. Intermediate voltage Vm produced by the intermediate voltage generator does not need to have a large value, because it is only used for electrically isolating base substrate 110 from first low-voltage well 156 and/or second low-voltage well 164. For example, the intermediate voltage generator may generate intermediate voltage Vm by dividing the supply voltage Vcc or by pumping up a logic voltage. When the semiconductor integrated circuit devices are DDIs, chip size may not need to be increased to provide a space for the intermediate voltage generator because the DDIs may have extra space.

If second buried impurity layer 134 is coupled to intermediate voltage Vm, as described above, deep well 144 also may be needed to electrically isolate second buried impurity layer 134 from first low-voltage well 156 and/or second low-voltage well 164. When deep well 144 is formed using the same mask that is used for forming first high-voltage well 142 and/or second high-voltage well 146, this may eliminate the need for a separate mask for forming deep well 144.

Figure 7:
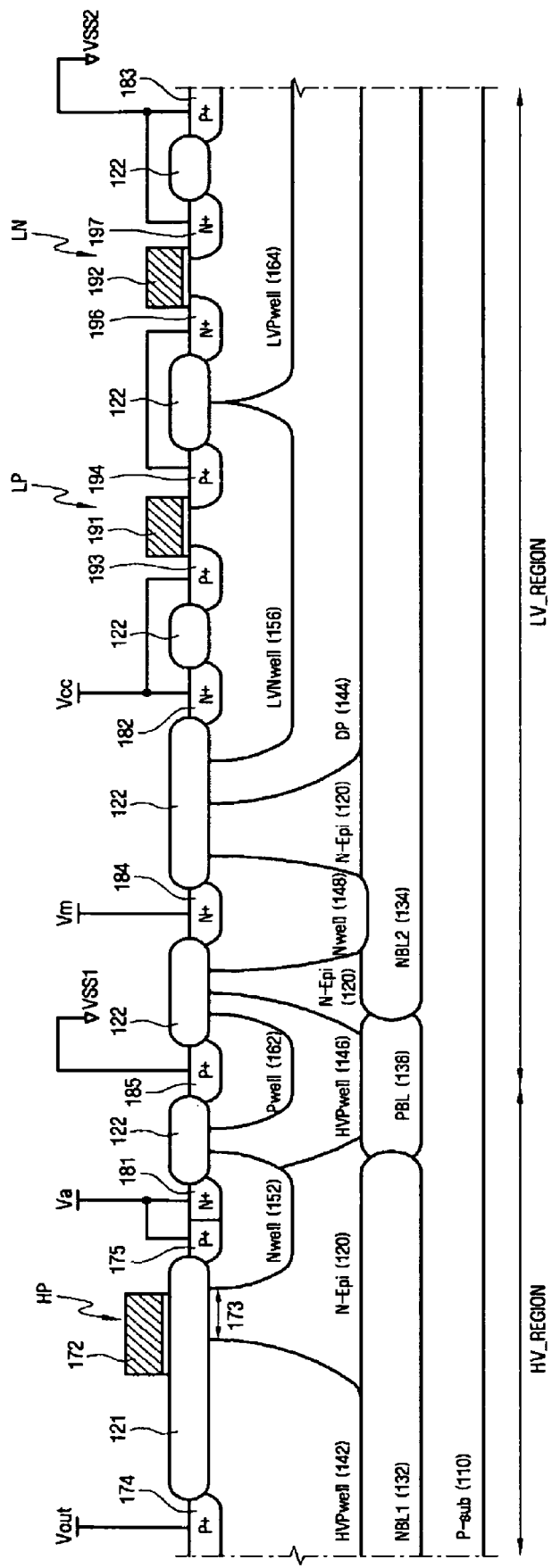
FIG. 7 is a cross-sectional view of a semiconductor integrated circuit device according to example embodiments.

FIG. 7 is a cross-sectional view of a semiconductor integrated circuit device according to example embodiments. Unlike example embodiments described above, the semiconductor integrated circuit devices according to example embodiments may include fourth well 148 of a second conductivity type formed to contact second buried impurity layer 134.

Although not shown, first well (154 in FIG. 2) may also be formed within fourth well 148.

While example embodiments have been particularly shown and described, it will be understood by those of ordinary skill in the art that various changes in form and details may be made therein without departing from the spirit and scope of the present invention as defined by the following claims.

What is claimed is:

1. A semiconductor integrated circuit device, comprising:
a substrate that includes a high-voltage device region and a low-voltage device region defined on the substrate;
a first buried impurity layer formed in at least a portion of the high-voltage device region and coupled to a first voltage;
a second buried impurity layer formed in at least a portion of the low-voltage device region and coupled to a second voltage less than the first voltage; and
a well formed on the second buried impurity layer in the low-voltage device region and coupled to a third voltage less than the second voltage.

2. The device of claim 1, wherein the first buried impurity layer, the second buried impurity layer, and the well are electrically isolated from one another.

3. The device of claim 1, further comprising:
a deep well formed on the second buried impurity layer in the low-voltage device region;
wherein the well is formed within the deep well.

4. The device of claim 3, wherein the second buried impurity layer and the deep well have opposite conductivity types.

5. The device of claim 1, further comprising:
a third buried impurity layer formed between the first buried impurity layer and the second buried impurity layer; and
an isolating well formed on the third buried impurity layer;
wherein the first and second buried impurity layers have a same conductivity type, and
wherein the third buried impurity layer and the isolating well have a conductivity type opposite to the conductivity type of the first and second buried impurity layers.

6. The device of claim 5, wherein the third buried impurity layer and the well are coupled to a fourth voltage less than the third voltage.

7. The device of claim 1, further comprising:
a high-voltage transistor formed in the high-voltage device region;
wherein the high-voltage transistor has a drift region and a channel region formed between a source and drain.

8. The device of claim 7, wherein the drift region is in contact with the first buried impurity layer.

9. The device of claim 1, wherein the substrate includes a base substrate and an epitaxial layer formed on the base substrate, and
wherein the base substrate and the epitaxial layer have opposite conductivity types.

10. The device of claim 9, wherein the first and second buried impurity layers are formed at an interface between the base substrate and the epitaxial layer.

11. The device of claim 1, wherein the first voltage is greater than or equal to about 50 V and less than or equal to about 70 V,
wherein the second voltage is greater than or equal to about 10 V and less than or equal to about 30 V, and
wherein the third voltage is greater than or equal to about 1 V and less than or equal to about 5 V.

12. The device of claim 1, wherein the semiconductor integrated circuit device is a display driver integrated circuit (DDI).

13. A semiconductor integrated circuit device, comprising:
a substrate that includes a base substrate of a first conductivity type and an epitaxial layer of a second conductivity type formed on the base substrate;
a first buried impurity layer of the second conductivity type formed in at least a portion of an interface between the base substrate and the epitaxial layer;
a deep well of the first conductivity type formed on the first buried impurity layer; and
a semiconductor device formed on the deep well;
wherein the semiconductor device operates using a first voltage, and
wherein the first buried impurity layer is coupled to a second voltage greater than the first voltage.

14. The semiconductor integrated circuit device of claim 13, wherein the first conductivity type is a P-type and the second conductivity type is an N-type.

15. The semiconductor integrated circuit device of claim 13, further comprising:
an ohmic contact of the second conductivity type that is formed on a surface of the epitaxial layer so as to surround the semiconductor device and to which the second voltage is applied.

16. The semiconductor integrated circuit device of claim 13, wherein a high-voltage device region and a low-voltage device region are defined on the substrate, and
wherein the first buried impurity layer, the deep well, and the semiconductor device are formed in the low-voltage device region.

17. The semiconductor integrated circuit device of claim 16, further comprising:
a second buried impurity layer of the second conductivity type that is formed in at least a portion of the high-voltage device region and coupled to a third voltage higher than the second voltage.

18. The semiconductor integrated circuit device of claim 17, further comprising:
a high-voltage transistor of the first conductivity type that is formed in the high-voltage device region;
wherein the high-voltage transistor has a drift region and a channel region formed between a source and a drain.

19. The semiconductor integrated circuit device of claim 18, wherein the drift region is in contact with the second buried impurity layer.

20. The semiconductor integrated circuit device of claim 17, further comprising:
a third buried impurity layer of the first conductivity type that is formed between the first and second buried impurity layers; and
an isolating well of the first conductivity type that is formed on the third buried impurity layer.

* * * * *